United States Patent [19]

Uchiyama

[11] 3,786,624

[45] Jan. 22, 1974

[54] SOLAR CELL WATCH DIAL HAVING CALENDAR DISPLAY WINDOW

[75] Inventor: Hideaki Uchiyama, Swa, Japan

[73] Assignee: Kabushiki Kaisha Suwa Seikosha, Tokyo, Japan

[22] Filed: July 3, 1972

[21] Appl. No.: 268,325

[30] Foreign Application Priority Data

July 9, 1971 Japan ............................ 46/50870

[52] U.S. Cl. ........................ 58/23 C, 58/4, 58/58, 58/127 R

[51] Int. Cl. ........................ G04c 3/00, G04b 19/24

[58] Field of Search ........................ 58/4–6 R, 6 A, 58/23 R, 23 BA, 50 R, 58

[56] References Cited

UNITED STATES PATENTS

| | | | |
|---|---|---|---|
| 3,328,954 | 7/1967 | Miller | 58/23 |
| 3,427,797 | 2/1969 | Kimura et al. | 58/23 BA |
| 3,367,104 | 2/1968 | Rogers | 58/4 R X |
| 3,630,015 | 1/1970 | Lehovec | 58/50 R |

*Primary Examiner*—Stephen J. Tomsky
*Attorney, Agent, or Firm*—Blum, Moscovitz, Friedman & Kaplan

[57] ABSTRACT

A timepiece has a plurality of solar cell elements arranged on the surface of the dial thereof, the dial being formed with a window through which a time or calendar indication may be viewed. The portion of one or more of the solar cell elements in the region of the window is removed. The elements having portions removed are connected in parallel with each other if the total light receiving area thereof is not less than the light receiving area of other of said elements, otherwise, the elements having portions removed are electrically disconnected from the other of said elements.

2 Claims, 4 Drawing Figures

SOLAR CELL WATCH DIAL HAVING CALENDAR DISPLAY WINDOW

BACKGROUND OF THE INVENTION

This invention relates to the arrangement of solar cells on a watch dial having a window indicating date, day or time in a small-size timepiece such as a wrist watch and the like.

In watches wherein solar cells (photo electric elements) are arranged on the watch dial, the energy produced by said elements is stored in a secondary battery as a source of energy for the watch. Where it is necessary to provide a window indicating date, day or time, it is necessary to insure that such window is provided without reducing the effectiveness of the output to be obtained from said solar cells.

SUMMARY OF THE INVENTION

Generally speaking, in accordance with the invention, a timepiece is provided having a dial formed with a window therethrough for viewing at least one of the date, day, hour, minute and second indications. A plurality of solar cell elements of essentially uniform light receiving area are mounted on said dial other than in the region of said window. Circuit means is provided for connecting said plurality of solar cell elements in series.

At least two further solar cell elements may be mounted on said watch dial in the region of said window but out of overlapping relation therewith, each of said further solar cell elements having a light receiving area less than the light receiving area of said first-mentioned plurality of solar cell elements by reason of the presence of said window. The total light receiving area of said further solar cell element is at least equal to the light receiving area of one of said first-mentioned plurality of solar cell elements. Circuit means is provided for connecting said further solar cell elements in parallel, said parallel connected further solar cell elements being connected in series with said first-mentioned plurality of solar cell elements.

At least one further solar cell element may be mounted on said watch dial in the region of said window, the total area of said further solar cell elements being less than the area of each of said first-mentioned solar cell elements, said further solar cell elements being electrically disconnected from said first-mentioned solar cell elements.

Accordingly, it is an object of this invention to provide a solar cell watch dial having a calendar display window for maximizing the output of said solar cells.

Still other objects and advantages of the invention will in part be obvious and will in part be apparent from the specification and drawings.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
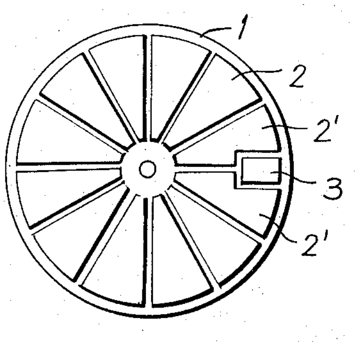
FIG. 1 is a top plan view of one embodiment of the watch dial in accordance with the invention.
Figure 2:
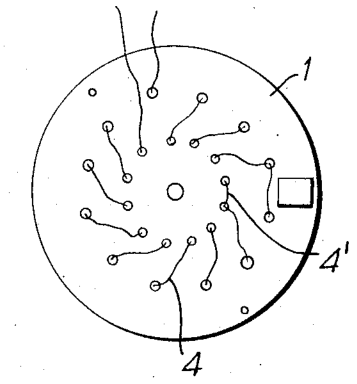
FIG. 2 is a back plan view of the watch dial of FIG. 1.

Referring now to FIGS. 1 and 2, watch dial 1 is provided with a plurality of pie-shaped solar cell elements 2 mounted thereon, said solar cell elements having essentially uniform light receiving areas. A single solar cell element would not produce the voltage necessary for charging the secondary battery (not shown), and accordingly, each of the solar cell elements 2 are connected in series by lead wires 4 at the back of the dial, as depicted in FIG. 2. A window 3 is formed in the dial through which the date, day or time may be viewed. In the region of calendar 3, two further substantially pie-shaped solar cell elements 2′ are provided, each of said further solar cell elements being formed with a notch in the region of said window so as not to overlap said window.

The output current of a solar cell is proportional to the light receiving area of the light receiving element thereof. The output current of solar cell element 2′ which is formed with the notch, is smaller than that of solar cell elements 2. If each of the solar cell elements 2 and 2′ were connected in series, the output current of the whole solar cell system would be limited by the current of element 2′ and would become equal to the output current of element 2′. Thus, if the light receiving area of each of the elements 2 is represented by A, the light receiving area of each element 2′ is represented by A′, the total number of elements is represented by $n$, and $$(A - A')/A > 1/n$$

then a large output can be obtained by $n - 1$ operative elements.

Accordingly, as depicted in FIGS. 1 and 2, if two of the solar cell elements are formed with a notch for providing access to window 3, these elements are connected in parallel at the back of the dial by lead wire 4′, and said parallel-connected elements 2′ are connected in series with the remaining elements 2. If the sum of the light receiving areas of the two notched elements 2A′ lies within the range 2A′>A, the output produced by $n$−1 elements each having a light receiving area A connected in series can be obtained independent of the size of the window.

Figure 3:
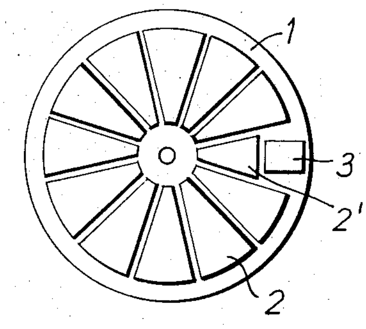
FIG. 3 is a top plan view showing a second embodiment of the watch dial in accordance with the invention.
Figure 4:
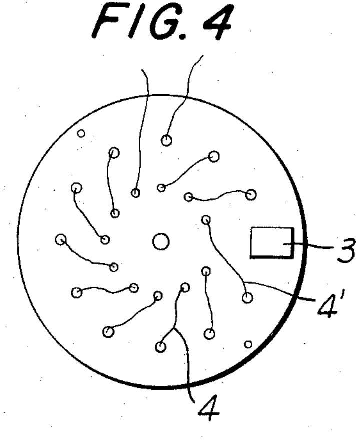
FIG. 4 is a back plan view of the watch dial of FIG. 3.

A second embodiment is depicted in FIGS. 3 and 4, wherein only one element 2′ has a portion cut away to prevent overlapping of window 3. This element 2′ is electrically unconnected to the other solar cell elements 2 so that the output of $n$−1 element connected in series, each element having a light receiving area A, can be obtained independent of the size of the window.

It will thus be seen that the objects set forth above, and those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. In a timepiece having a battery and a dial formed with a window therethrough permitting viewing of at least one of date, day, hour, minute and second indications energized by said battery, the improvement comprising a plurality of solar cell elements for storing energy in said battery and mounted on the surface of said dial except in the region of said window, said plurality of solar cell elements being of substantially uniform light receiving areas; at least two further solar cell elements mounted on said dial in the region of said window but out of overlapping relation therewith, each of said further solar cell elements being formed with cut away regions at least in part defining said window and having a light receiving area less than the light receiving area of each of said plurality of first-mentioned solar cell elements, the sum of the light transmitting area of said further solar cell elements being at least equal to the area of one of said plurality of solar cell elements; and circuit means for interconnecting said further solar cell elements in parallel and said plurality of first-mentioned solar cell elements in series with each other and the parallel connection of said further solar cell element.

2. A timepiece as recited in claim 1, wherein each of said plurality of first-mentioned solar cell elements are essentially pie-shaped, each of said further solar cell elements being essentially pie-shaped except for the portion thereof which would otherwise overlap said window.

* * * * *